(12) United States Patent
Li et al.

(10) Patent No.: US 12,188,114 B2
(45) Date of Patent: Jan. 7, 2025

(54) FILM MASK, MANUFACTURING METHOD THEREOF, DISPLAY PANEL, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Jianbo Li, Beijing (CN); Jianpeng Wu, Beijing (CN); Yan Huang, Beijing (CN); Tong Niu, Beijing (CN); Wenbiao Ding, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 447 days.

(21) Appl. No.: 17/598,895

(22) PCT Filed: Dec. 22, 2020

(86) PCT No.: PCT/CN2020/138368
§ 371 (c)(1),
(2) Date: Sep. 28, 2021

(87) PCT Pub. No.: WO2022/133737
PCT Pub. Date: Jun. 30, 2022

(65) Prior Publication Data
US 2022/0396867 A1    Dec. 15, 2022

(51) Int. Cl.
*C23C 14/04* (2006.01)
*C23C 14/24* (2006.01)
*H10K 71/00* (2023.01)

(52) U.S. Cl.
CPC ............ *C23C 14/042* (2013.01); *C23C 14/24* (2013.01); *H10K 71/00* (2023.02)

(58) Field of Classification Search
CPC ........ H10K 71/166; C30B 25/04; C23C 8/04; C23C 10/04; C23C 14/04; C23C 14/042;
(Continued)

(56) References Cited

U.S. PATENT DOCUMENTS

2010/0080915 A1\* 4/2010 Masuda ................ C23C 14/042
118/504
2011/0146573 A1\* 6/2011 Park ....................... C23C 14/042
118/712
(Continued)

FOREIGN PATENT DOCUMENTS

CN    103160775 A    6/2013
CN    105839052 A    8/2016
(Continued)

*Primary Examiner* — Aiden Lee
(74) *Attorney, Agent, or Firm* — Ling Wu; Stephen Yang; Ling and Yang Intellectual Property

(57) ABSTRACT

A film mask, a manufacturing method thereof, a display panel and a display device are provided. The mask includes a frame and a first align mask. The frame includes two first frame edges extending along a first direction and arranged at intervals along a second direction and two second frame edges extending along the second direction and arranged at intervals along the first direction. The first frame edges and the second frame edges intersect to form a quadrilateral. The first frame edges and the second frame edges include first surfaces and second surfaces which are oppositely disposed. The first surfaces of at least three angles of the four angles are provided with the first align mask. The first align mask is provided with a first align identifier. The first direction intersects with the second direction.

12 Claims, 5 Drawing Sheets

(58) Field of Classification Search
CPC ..... C23C 14/044; C23C 16/04; C23C 16/042; C23C 18/06
See application file for complete search history.

(56) References Cited

U.S. PATENT DOCUMENTS

| | | |
|---|---|---|
| 2018/0202034 A1 | 7/2018 | Lin et al. |
| 2019/0044068 A1 | 2/2019 | Jiang et al. |
| 2019/0368028 A1* | 12/2019 | Yamabuchi ........... H01L 21/033 |
| 2019/0378984 A1 | 12/2019 | Nakamura et al. |
| 2021/0332470 A1 | 10/2021 | Qi |
| 2022/0013396 A1 | 1/2022 | Mei et al. |
| 2022/0216412 A1* | 7/2022 | Zhang ................. H10K 71/166 |

FOREIGN PATENT DOCUMENTS

| | | |
|---|---|---|
| CN | 106191769 A | 12/2016 |
| CN | 107557731 A | 1/2018 |
| CN | 107653436 A | 2/2018 |
| CN | 108611600 A | 10/2018 |
| CN | 110438448 A | 11/2019 |
| CN | 110527949 A | 12/2019 |
| CN | 110629160 A | 12/2019 |
| CN | 111286695 A | 6/2020 |
| CN | 111471959 A | 7/2020 |
| CN | 111471960 A | 7/2020 |
| WO | 2018110253 A1 | 6/2018 |
| WO | 2018147339 A1 | 8/2018 |
| WO | 2020032509 A1 | 2/2020 |

* cited by examiner

FILM MASK, MANUFACTURING METHOD THEREOF, DISPLAY PANEL, AND DISPLAY DEVICE

TECHNICAL FIELD

The present disclosure relates to, but is not limited to, the technical field of display, in particular to a film mask, a manufacturing method thereof, a display panel and a display device.

BACKGROUND

Organic Light Emitting Diode (OLED) devices have excellent characteristics such as ultra-thinness, self-luminosity, organic material, planar structure, low-temperature manufacturing process, and compatibility with plastic substrate and can be used as display panel. In the OLED production process, evaporation is one of the links that affect its yield most. In the current evaporation process, film masks are widely used to control evaporation pixels.

SUMMARY

The following is a summary of subject matter described in detail herein. This summary is not intended to limit the protection scope of the claims.

In one aspect, the embodiments of the present disclosure discloses a film mask. The film mask includes a frame and a first align mask. The frame includes two first frame edges extending along a first direction and arranged at intervals along a second direction and two second frame edges extending along the second direction and arranged at intervals along the first direction. The first frame edges and the second frame edges intersect to form a quadrilateral. The first frame edges and the second frame edges include first surfaces and second surfaces which are oppositely disposed. The first surfaces of at least three angles of the four angles are provided with the first align mask. The first align mask is provided with a first align identifier. The first direction intersects with the second direction.

In some exemplary embodiments, the first align mask includes a first side and a second side arranged at intervals along the first direction, and a third side and a fourth side arranged at intervals along the second direction. The first align identifier is disposed in an area enclosed by the first side, the second side, the third side and the fourth side, and at least two of the first side, the second side, the third side and the fourth side are fixedly connected with the frame.

In some exemplary embodiments, the length of the first align mask in the first direction is 9 mm to 20 mm and the length of the first align mask in the second direction is 9 mm to 20 mm.

In some exemplary embodiments, a mask sheet is also provided and the mask sheet includes a support frame which includes two first side strips extending along the first direction and arranged at intervals along the second direction and two second side strips extending along the second direction and arranged at intervals along the first direction. The ends of the first side strips and the second side strips are connected, and the first side strips and the second side strips define an evaporation area. The first surface of the first frame edge is provided with a first mounting groove on an inner edge, and the first surface of the second frame edge is provided with a second mounting groove on an inner edge.

The first side strip is lapped in the first mounting groove and the second side strip is lapped in the second mounting groove.

In some exemplary embodiments, a distance between the surface of the first side strip away from the frame and the second surface is approximately equal to the distance between the first surface and the second surface. The distance between the surface of the second side strip away from the frame and the second surface is approximately equal to the distance between the first surface and the second surface.

In some exemplary embodiments, the first side strip is provided with a plurality of test holes arranged at intervals along the first direction, and/or the second side strip is provided with a plurality of test holes arranged at intervals along the second direction.

The orthographic projection of the test holes on the plane of the first surface does not overlap with the first surface.

In some exemplary embodiments, a second align mask is also provided. The second align mask is disposed on the first frame edge or the second frame edge and is provided with a second align identifier.

In some exemplary embodiments, the second align mask is provided on the first frame edge and is disposed in the middle of the first frame edge.

Alternatively, the second align mask is provided on the second frame edge and is disposed in the middle of the second frame edge.

In some exemplary embodiments, the second align mask is provided on the first frame edge, and the centers of the first align identifier and the second align identifier on the same first frame edge are disposed on a first straight line parallel to the first direction.

Alternatively, the second align mask is provided on the second frame edge and the centers of the first align identifier and the second align identifier on the same first frame edge are disposed on a second straight line parallel to the second direction.

In some exemplary embodiments, the second align mask includes a fifth and a sixth side arranged at intervals along the first direction, and a seventh and an eighth side arranged at intervals along the second direction. The second align identifiers are disposed in the area enclosed by the fifth, sixth, seventh and eighth side, and at least two of the fifth, sixth, seventh and eighth side are fixedly connected with the frame.

In some exemplary embodiments, the length of the second align mask in the first direction is 9 mm to 20 mm, and the length of the second align mask in the second direction is 9 mm to 20 mm.

In some exemplary embodiments, the second align mask is connected with the second side strip. The second frame edge is provided with an align mask mounting groove communicating with the second mounting groove and corresponding to the position of the second align mask. The second align mask is embedded in the align mask mounting groove.

Alternately, the first align mask is connected with the first side strip, and the first frame edge is provided with an align mask mounting groove communicating with the first mounting groove and corresponding to the position of the second align mask. The second align mask is embedded in the align mask mounting groove.

In another aspect, an embodiment of the present disclosure further provides a display substrate manufactured with the film mask described in the above embodiments.

In another aspect, an embodiment of the present disclosure further provides a display device that includes the display panel provided in the aforementioned embodiment.

In another aspect, an embodiment of the present disclosure further provides a method for manufacturing the film mask which includes the following acts: fixing a frame, wherein the frame includes two first frame edges extending along a first direction and arranged at intervals along a second direction and two second frame edges extending along the second direction and arranged at intervals along the first direction, the first frame edges and the second frame edges intersect to form a quadrilateral, and the first frame edges and the second frame edges includes first surfaces and second surfaces which are oppositely disposed; forming a first align mask on the first surface of the frame, wherein the first align mask is formed on at least three of the four angles of the quadrilateral, the first align mask is provided with a first align identifier, and the first direction intersects with the second direction.

In some exemplary embodiments, forming the first align mask on the first surface of the frame includes: fixing the align mask on the first frame edge or on the second frame edge by a netting process, a first align identifier being provided on the align mask, cutting the align mask with the peripheral area of the first align identifier being kept to form the first align mask.

In some exemplary embodiments, the align mask is provided with a second align identifier, and the manufacturing method further includes: cutting the align mask with the peripheral area of the second align identifier kept and forming the second align mask.

In some exemplary embodiments, prior to forming the first align mask on the first surface of the frame, the manufacturing method further includes: fixing a mask sheet on the frame, wherein the mask sheet includes a support frame and a second align mask provided on the support frame, the frame is provided with a align mask mounting groove at a position corresponding to the second align mask, and the second align mask is embedded in the align mask mounting groove.

Other aspects will be understood after the drawings and the detailed description are read and understood.

DESCRIPTION OF REFERENCE SIGNS

Figure 1:
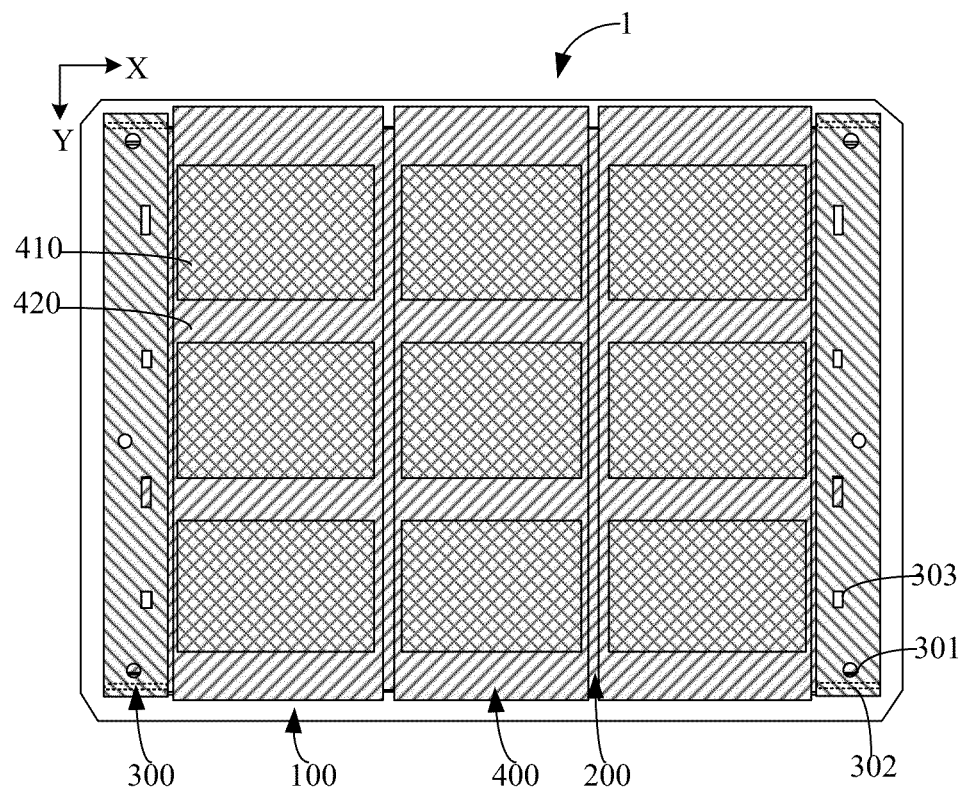
FIG. 1 is a schematic diagram of the structure of a film mask.

| | | |
|---|---|---|
| 1 film mask | 100 frame | 101 angle |
| 102 first surface | 103 second surface | 110 first frame edge |
| 111 first mounting groove | 112 third mounting groove | 120 second frame edge |
| 121 second mounting groove | 122 fourth mounting groove | 123 fifth mounting groove |
| 200 mask sheet | 201 evaporation area | 202 sub evaporation area |
| 210 support frame | 211 first side strip | 212 second side strip |
| 213 first fixing protrusion | 214 second fixing protrusion | 220 first support strip |
| 230 second support strip | 300 align mask | 301 align hole |
| 302 bonding area | 303 test hole | 303a first test hole |
| 303b second test hole | 310 first align mask | 311 first align identifier |
| 320 second align mask | 321 second align identifier | 322 fifth side |
| 323 sixth side | 324 seventh side | 325 eighth side |
| 400 fine film mask | 410 mask pattern area | 420 mask shielding area |
| 500 interval | 2 substrate | 3 solute |

DETAILED DESCRIPTION

Embodiments of the present disclosure will be described in detail hereinafter with reference to the accompanying drawings. It should be noted that the embodiments may be implemented in many different forms. Those of ordinary skills in the art may readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In this specification, for sake of convenience, wordings, such as "central", "upper", "lower", "front", "rear", "vertical", "horizontal", "top", "bottom", "inner", "outer" and the like which are used to indicate orientational or positional relations, to describe the positional relations between constituent elements with reference to the drawings, are only for a purpose of facilitating description of this specification and simplifying the description, rather than indicating or implying that the device or element referred to must have a specific orientation, or must be constructed and operated in a particular orientation, and therefore cannot be construed as limitations on the present disclosure. The positional relations between the constituent elements are appropriately changed according to the directions the constituent element described. Therefore, the wordings are not limited in the specification, and may be replaced appropriately according to situations.

In this specification, terms "install", "connect" and "couple" shall be understood in a broad sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art can understand the specific meanings of the above terms in the present disclosure in a case by case manner.

"About" in the present disclose means that limits of a value are not limited strictly, and the value is within a range of process and measurement errors.

Figure 2:
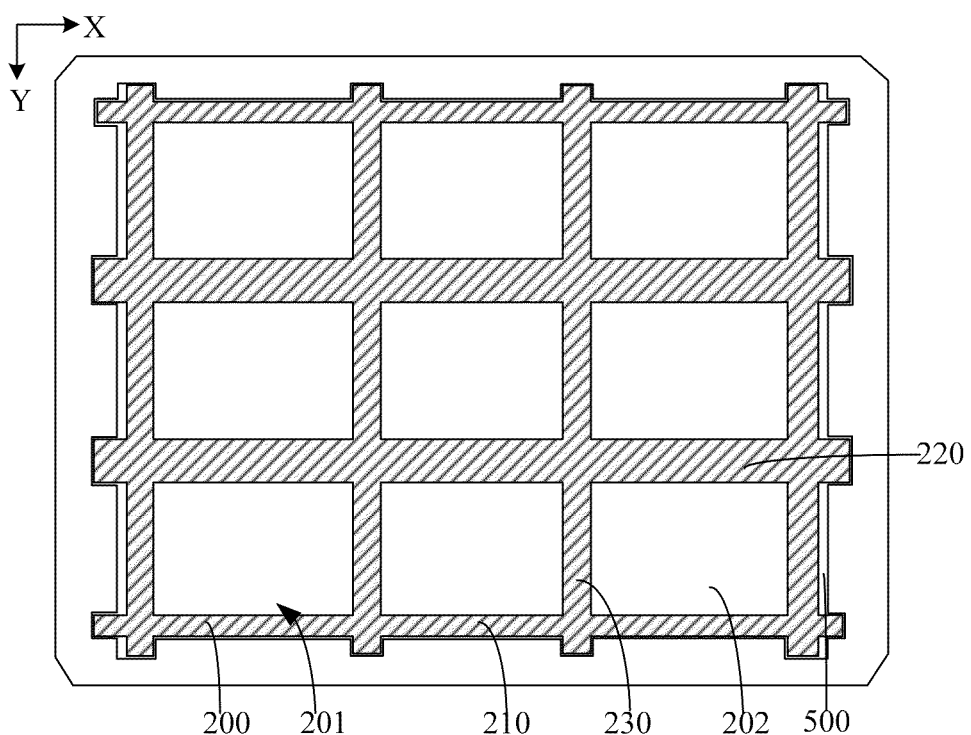
FIG. 2 is a diagram of the partial structure of the film mask shown in FIG. 1.
Figure 3:
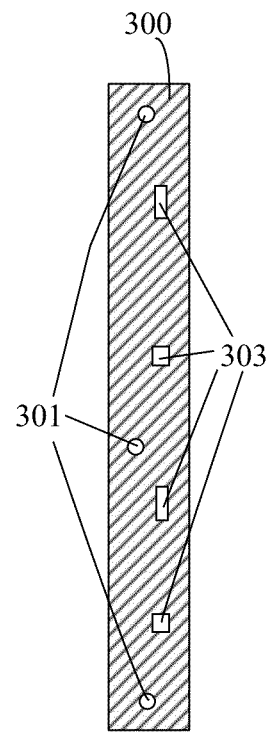
FIG. 3 is a schematic diagram of the structure of an align mask.

FIG. 1 is a schematic diagram of the structure of a film mask. FIG. 2 is a diagram of the partial structure of the film mask shown in FIG. 1. FIG. 3 is a schematic diagram of the structure of an align mask. In the process of OLED manufacture, a film mask is generally used for the control of the evaporation of the pixels of organic light-emitting layer. In some exemplary embodiments, as shown in FIGS. 1-3, a film mask 1 mainly includes a frame 100, and a mask sheet 200, an align mask 300 and a fine film mask 400 which are disposed on the frame 100. The mask sheet 200 includes a support frame 210, in which an evaporation area 201 is defined. The mask sheet 210 is provided with a plurality of first support strips 220 extending along the first direction X and arranged at intervals along the second direction Y, and a plurality of second support strips 230 extending along the second direction Y and arranged at intervals along the first direction X. The first support strips 220 and the second support strips 230 are at least disposed in the evaporation area 201. A plurality of evaporation areas are defined between the first support strips 220 and the second support strips 230. The support frame 210 is fixed on the frame 100 by netting process. At least two align masks 300 are provided and the two align masks 300 extend along the second direction Y and are arranged at intervals along the first direction X. The mask sheet 200 is disposed between two align masks 300 and overlaps with the align masks 300. The align mask 300 is provided with align holes 301 near the ends which are configured for accurate alignment of the substrate and the film mask 1. A bonding area 302 is provided on the align mask 300 between each align hole 301 and the end adjacent to the align hole 301, and the align mask 300 is bonded and fixed with the frame 100 at the bonding area 302. The align mask 300 may also be provided with a plurality of test holes 303 arranged at intervals along the second direction Y. There is an interval 500 between the frame edge of the mask sheet 210 overlapping with align mask 300 and the frame 100. The test holes 303 correspond to the positions of the intervals 500. The test holes 303 are used for forming a plurality of test sites on the substrate (for measuring the thickness and luminous performance etc. of the film layer). The fine film mask 400 is fixed on the frame 100 by a netting process, and may include a plurality of fine film masks 400 extending along the second direction Y and arranged at intervals along the first direction X. The fine film mask 400 includes a mask pattern area 410 and a mask shielding area 420 arranged at the periphery of the mask pattern area 410. The mask pattern area 410 corresponds to the sub-evaporation area 202. The mask shielding area 420 laps on the first support strip 220 and the second support strip 230. The mask pattern area 410 is provided with a plurality of via holes. After the film mask 1 is accurately aligned with the substrate through the align holes 301, the via holes of the mask pattern area 410 completely coincide with the positions on the substrate where organic materials need to be evaporated. The evaporation materials of the evaporation source can be evaporated on the substrate through the via holes to form a thin film with a preset pattern and thus, an accurate control of pixel evaporation is realized. During the evaporation, the higher the align accuracy, the better, so as to reduce the product color mixing caused by the misalignment between the substrate and the film mask 1.

Figure 4A:
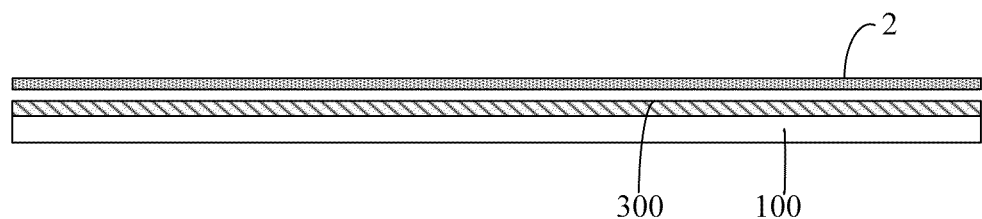
FIG. 4a is a positional diagram of a film mask and a substrate during evaporation.
Figure 4B:
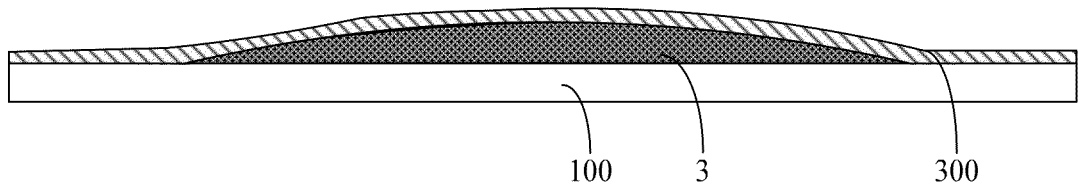
FIG. 4b is a schematic diagram of residual solute between the align mask and the frame.

FIG. 4a is a positional diagram of a film mask and a substrate during evaporation. FIG. 4b is a schematic diagram of residual solute between the align mask and the frame. During the evaporation, the side of the frame 100 provided with the align mask 300 is disposed opposite to the substrate 2. Since the align mask 300 is fixedly connected with the frame 100 only in the bonding area, there is an interval between the overlapping position of the align mask 300 and the frame 100 and the overlapping position of the mask sheet 200 and the align mask 300, and organic materials are often evaporated into the interval, but during cleaning of the film mask, the treatment liquid is hardly discharged out of the interval due to surface tension. Solute 3 becomes solid powder after the film mask is dried, and the powder drifts in the evaporation chamber when the film mask is reused. If the powder falls on the display area of the display substrate, it will cause dark spots, or break the packaging layer and cause packaging failure.

Embodiments of the present disclosure provided a film mask, which includes a frame and a first align mask. The frame includes two first frame edges extending along a first direction and arranged at intervals along a second direction and two second frame edges extending along the second direction and arranged at intervals along the first direction. The first frame edges and the second frame edges intersect to form a quadrilateral. The first frame edges and the second frame edges include first surfaces and second surfaces which are oppositely disposed. The first surfaces of at least three angles of the four angles are provided with the first align mask. The first align mask is provided with a first align identifier. The first direction intersects with the second direction.

A technical scheme of a film mask according to an exemplary embodiment of the present disclosure will be exemplified below with reference to the accompanying drawings.

Figure 5:
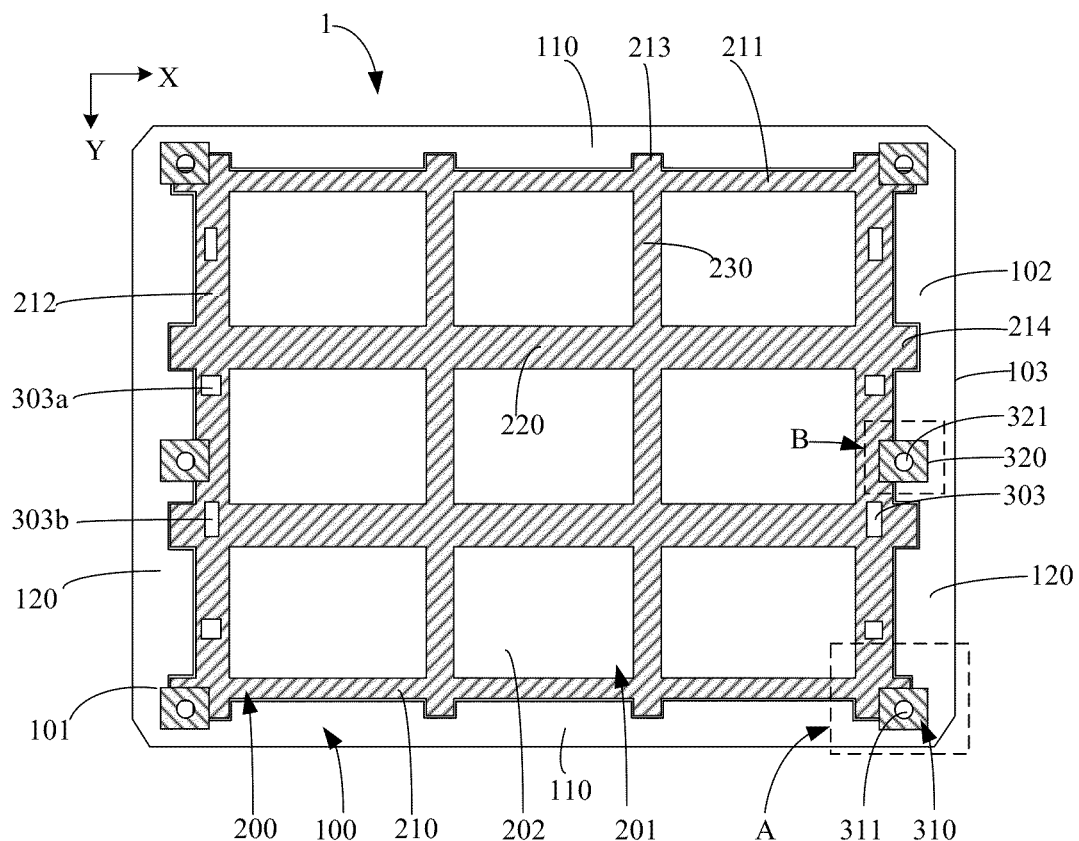
FIG. 5 is a diagram of the structure of a film mask according to an exemplary embodiment of the present disclosure.

FIG. 5 is a diagram of the structure of a film mask according to an exemplary embodiment of the present disclosure. In some exemplary embodiments, the film mask 1 includes a frame 100 and a first align mask 310. The frame 100 is used to support and fix the first align mask 310 and the fine film mask. The frame 100 includes two first frame edges 110 extending along the first direction X and arranged at intervals along the second direction Y and two second frame edges 120 extending along the second direction Y and arranged at intervals along the first direction X, the first direction X intersecting with the second direction Y. In some exemplary embodiments, the first direction X is perpendicular to the second direction Y, and the perpendicularity here can be understood as approximate perpendicularity, which may mean that the angle between the first direction X and the second direction Y is between 85 degrees and 95 degrees. The first frame edge 110 and the second frame edge 120 intersect to form a quadrilateral. The first frame edge 110 and the second frame edge 120 include a first surface 102 and a second surface 103 which are oppositely arranged, and the first surface 102 is configured as a surface opposite to the substrate during the evaporation. The first surfaces 102 of at least three angles 101 of the four angles 100 of the quadrilateral are provided with the first align mask 310. The first align mask 310 is provided with a first align identifier 311 which may be the first align hole. CCD can identify the position coordinates of the first align identifier 311 through the luminosity changes inside and outside the first align hole. In another exemplary embodiments, each of the four angles 101 may be provided with a first align mask 310.

In this exemplary embodiment, the first align mask 310 is disposed on the first surface 102 of at least three angles 101 of the four angles 101 of the frame 100, with only the peripheral area of the first align identifier 311 is kept. No interval exists between the first align mask 310 and the frame 100 and thus the problem of the cleaning liquid residue in the interval is avoided and the powder flotation in the display area of the display substrate due to the dried solute in the interval after the drying of the film mask 1 is prevented, which improve the product yield.

Figure 6:
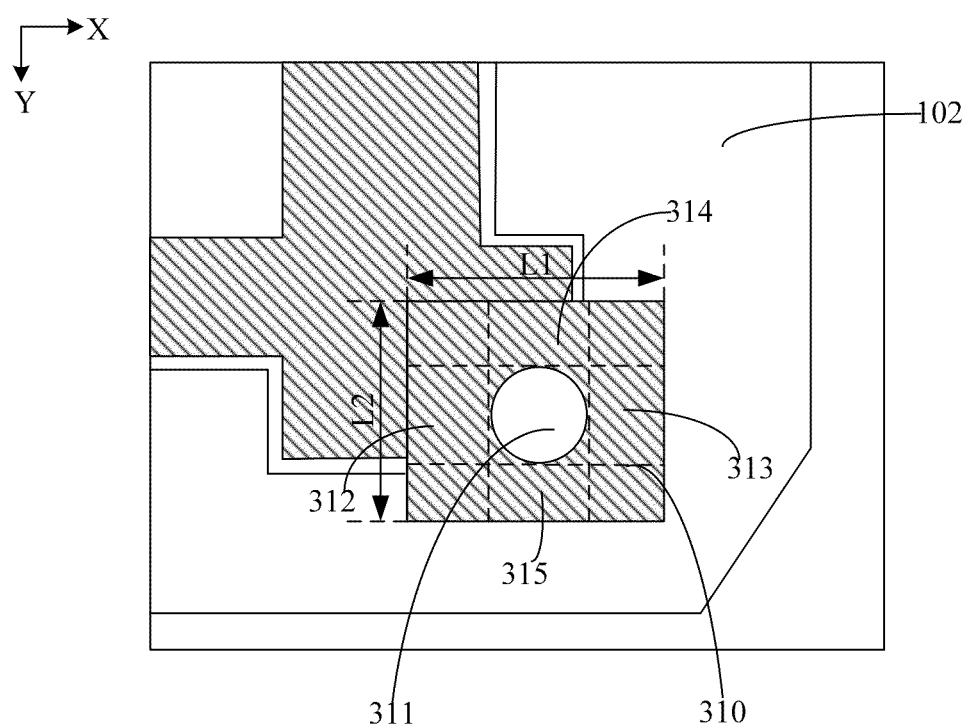
FIG. 6 is an enlarged view of A in FIG. 5.

FIG. 6 is an enlarged view of A in FIG. 5. In some exemplary embodiments, the first align mask 310 includes a first side 312 and a second side 313 arranged at intervals along the first direction X, and a third side 314 and a fourth side 315 arranged at intervals along the second direction Y. The first align identifier 311 is disposed in an area enclosed by the first side 312, the second side 313, the third side 314 and the fourth side 315, and at least two of the first side 312, the second side 313, the third side 314 and the fourth side 315 are fixedly connected with the frame 100. In some examples, the first side 312 and the second side 313 are fixedly connected with the frame 100, or the third side 314 and the fourth side 315 are fixedly connected with the frame 100, or one of the first side 312 and the second side 313 and one of the third side 314 and the fourth side 315 are fixedly connected with the frame 100. In other examples, the first side 312, the second side 313, the third side 314 and the fourth side 315 are all fixedly connected with the frame 100. In some exemplary embodiments, the fixed connection may be realized by bonding. At least two of the first side 312, the second side 313, the third side 314 and the fourth side 315 are fixedly connected with the frame 100, which can further prevent the interval between the first align mask 310 and the frame 100. In the actual evaporation, due to the magnetic force and electrostatic adsorption when the align mask 300 is attached to the substrate and separated from it, and due to the fixing mode of the align mask 300 and the frame 100 shown in FIG. 1, the bonding area between the align mask 300 and the frame 100 is small. With the increase of evaporation times, the align mask 300 becomes loose or even falls off, which causes the align hole 301 to deviate and results in slow alignment of the film mask 1 and the substrate. In this example, at least two of the first side 312, the second side 313, the third side 314 and the fourth side 315 are fixedly connected with the frame 100, which improves the stability of the connection between the first align mask 310 and the frame 100 and prevents the deviation of the first align identifier 311 due to the loosening or falling off of the first align mask 310.

In some exemplary embodiments as shown in FIG. 6, the length L1 of the first align mask 310 in the first direction X is 9 mm to 20 mm and the length L2 of the first align mask 310 in the second direction Y is 9 mm to 20 mm. The orthographic projection of the first align mask 310 on the first surface 102 may be rectangular. The first align identifier 311 is a first align hole, and the diameter of the first align hole is about 0.15 mm to 0.5 mm, such as 0.2 mm. In a direction perpendicular to the first surface 102, a thickness of the first align mask 310 may be about 30 micron to 100 microns.

In some exemplary embodiments, the first align mask 310 may be made of invar alloy, and the frame 100 may be made of invar alloy. Invar Alloy is an iron-based low thermal expansion alloy containing 36% nickel, and its average linear expansion coefficient in the range of $-50°$ C.$\sim100°$ C. is lower than $1.5\times10\text{-}6/°$ C. Using invar alloy can improve the accuracy of the pixel evaporation control of the film mask 1.

Figure 7:
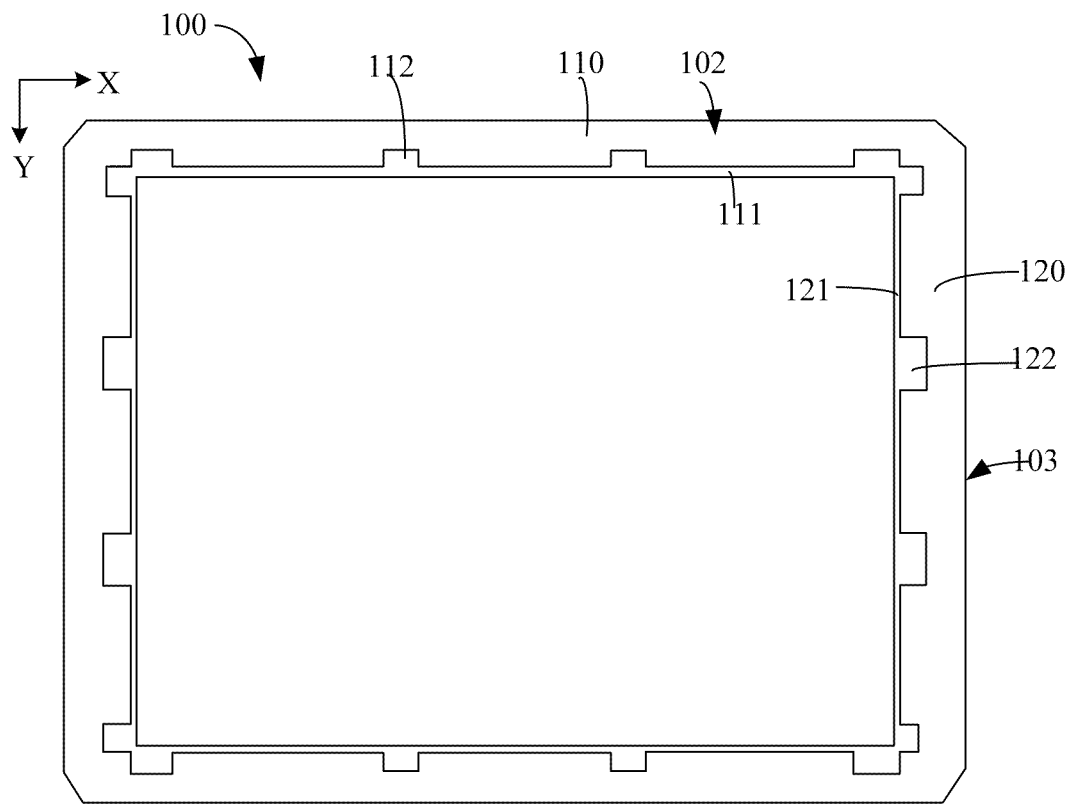
FIG. 7 is a schematic diagram of a structure of a frame according to an exemplary embodiment of the present disclosure.

FIG. 7 is a schematic diagram of a structure of a frame according to an exemplary embodiment of the present disclosure. In some exemplary embodiments, as shown in FIGS. 5 and 7, the film mask 1 also includes mask sheet 200 and the mask sheet 200 includes a support frame 210 which includes two first side strips 211 extending along the first direction X and arranged at intervals along the second direction Y and two second side strips 212 extending along the second direction Y and arranged at intervals along the first direction X. The ends of the first side strips 211 and the second side strips 212 are connected, and the first side strips 211 and the second side strips 212 define an evaporation area 201. The first surface 102 of the first frame edge 110 is provided with a first mounting groove 111 on the inner edge and the first surface 102 of the second frame edge 120 is provided with a second mounting groove 121 on the inner edge. The first side strip 211 is lapped in the first mounting groove 111 and the second side strip 212 is lapped in the second mounting groove 121. There is no interval 500 between the mask sheet 210 and the frame 100 as shown in FIG. 2. The distance between the surface of the first side strip 211 away from the frame 100 and the second surface 103 is equal to that between the first surface 102 and the second surface 103, and the distance between the surface of the second side strip 212 away from the frame 100 and the second surface 103 is equal to that between the first surface 102 and the second surface 103. That is, the surface of the first side strip 211 away from the frame 100 is flush with the first surface 102, and the surface of the second side strip 212 away from the frame 100 is flush with the first surface 102. Being flush may be understood as being roughly equal. The ratio of the distance between the surface of the first side strip 211 away from the frame 100 and the second surface 103 to the distance between the first surface 102 and the second surface 103 may be 0.95-1.05. The ratio of the distance between the surface of the second side strip 212 away from the frame 100 and the second surface 103 to the distance between the first surface 102 and the second surface 103 may be 0.95-1.05.

In some exemplary embodiments, as shown in FIG. 5, the mask sheet 200 further includes a plurality of first support strips 220 extending along the first direction X and arranged at intervals along the second direction Y and second support strips 230 extending along the second direction Y and arranged at intervals along the first direction X, the ends of the first support strips 220 are connected with corresponding second side strips 212, and the ends of the second support strips 230 are connected with corresponding first side strips 211. The first support strip 220 and the second side strip 230 divide the evaporation 201 into a plurality of sub-evaporation areas 202.

In some exemplary embodiments, the mask sheet 200 may be made of invar alloy. In a direction perpendicular to the first surface 102, a thickness of the mask sheet 200 may be about 30 micron to 100 microns.

In some exemplary embodiments, as shown in FIG. 5, the first side strip 211 is provided with a plurality of test holes 303 arranged at intervals along the first direction X, or the second side strip 212 is provided with a plurality of test holes 303 arranged at intervals along the second direction Y. The orthographic projections of the test holes 303 on the plane of the first surface 102 do not overlap with the first surface 102. The test holes 303 are used for forming a plurality of test sites on the substrate for measuring the thickness and luminous performance of the film layer. The test hole 303 may be disposed on at least one of the two first side strips 211, or at least one of the two second side strips 212, or at least one of the two first side strips 211 and at least one of the two second side strips 212. Whether the test holes 303 are disposed on the first side strip 211 or on the second side strip 212 is determined by the direction along which the fine film mask is arranged, the test holes 303 are generally disposed on both sides of the direction along which the fine film mask extends. That is to say, as the two sides along the second direction shown in FIG. 1, to prevent the fine film masks from blocking the test holes 303, in other exemplary embodiments, the test holes 303 may also be arranged in the interval between adjacent fine film masks. The plurality of test holes 303 may include a first test hole 303a and a second test hole 303b. The first test hole 303a is for detecting the luminosity performance of the film layer and the second test hole 303b is for detecting the thickness of the film layer. The first test hole 303a and the second test hole 303b may have the same or different size. The orthographic projection of the first test hole 303a and the second test hole 303b on the first surface 102 can be rectangular. For example, the first test hole 303a is square and the second test hole 303b is rectangular. The quantity of the first test holes 303a may be 2, 3, 4 or more, and the quantity of the second test holes 303b may be 2, 3, 4 or more, which are not limited here.

In some exemplary embodiments, the length of the test hole 303 in the first direction X may be about 0.15 mm to 2 mm, and the length of the test hole 303 in the second direction Y may be about 0.15 mm to 2 mm.

In some exemplary embodiments, as shown in FIGS. 5 and 7, the mask sheet 200 further includes a plurality of first fixing protrusions 213 disposed on the first side strip 211 and extending away from the evaporation area 201, and a plurality of second fixing protrusions 214 disposed on the second side strip 212 and extending away from the evaporation area 201. A third mounting groove 112 communicating with the first mounting groove 111 and corresponding to the first fixing protrusion 213 is provided on the first surface 102 of the first frame edge 110, and a fourth mounting groove 122 communicating with the second mounting groove 121 and corresponding to the second fixing protrusion 214 is provided on the first surface 102 of the second frame edge 120. The first fixing protrusion 213 is embedded into the third mounting groove 112, and the second fixing protrusion 214 is embedded into the fourth mounting groove 122. The distance between the surface of the first fixing protrusion 213 away from the frame 100 and the second surface 103 is equal to that between the first surface 102 and the second surface 103. The distance between the surface of the second fixing protrusion 214 away from the frame 100 and the second surface 103 is equal to that between the first surface 102 and the second surface 103. That is the surface of the first fixing protrusion 213 away from the frame 100 is flush with the first surface 102, and the surface of the second fixing protrusion 214 away from the frame 100 is flush with the first surface 102. Being flush may be understood as being roughly equal. The ratio of the distance between the surface of the first fixing protrusion 213 away from the frame 100 and the second surface 103 to the distance between the first surface 102 and the second surface 103 may be 0.95-1.05. The ratio of the distance between the surface of the second fixing protrusion 214 away from the frame 100 and the second surface 103 to the distance between the first surface 102 and the second surface 103 may be 0.95-1.05. In an exemplary embodiment, the first fixing protrusion 213 corresponds to the position of the second support strip 230, and the second fixing protrusion 214 corresponds to the position of the first support strip 220.

In some exemplary embodiments, as shown in FIG. 5, the orthographic projection of the first align mask 310 on the plane of the first surface 102 overlaps with the orthographic projection of the mask sheet 200 on the surface of the first surface 102.

In some exemplary embodiments, as shown in FIG. 5, film mask 1 further includes a second align mask 320 which is disposed on the first frame edge 110 and/or the second frame edge 120. For example, in an example, the second align mask 320 is disposed on two first frame edge 110. In another example, the second align mask 320 is disposed on the two second frame edge 120. The second align mask 320 is provided with a second align identifier 321. The second align identifier 321 may be a second align hole. The first align identifier 311 is disposed to accurately align the film mask 1 with the substrate. The second align identifier 321 is disposed to roughly align the film mask 1 with the substrate. In other exemplary embodiments, the second align identifier 321 can also be used to accurately align the film mask 1 with the substrate.

In some exemplary embodiments, as shown in FIG. 5, the second align mask 320 is disposed on the second frame edge 120, and the second align mask 320 is located in the middle of the second frame edge 120. The middle of the second frame edge 120 can be understood as one-fourth to three-fourths of the length of the second frame edge 120 along the first direction, such as half of the length.

In another exemplary embodiment, the second align mask 320 is disposed on the first frame edge 110, and the second align mask 320 is located in the middle of the first frame edge 110. The middle of the first frame edge 110 can be understood as one-fourth to three-fourths of the length of the first frame edge 110 along the first direction, such as half of the length.

In some exemplary embodiments, the second align mask 320 is provided on the first frame edge 110, and the centers of the first align identifier 311 and the second align identifier 321 on the same first frame edge 110 are disposed on a first straight line parallel to the first direction X.

In some exemplary embodiments, as shown in FIG. 5, the second align mask 320 is provided on the second frame edge 120 and the centers of the first align identifier 311 and the second align identifier 321 on the same second frame edge 120 are disposed on a second straight line parallel to the second direction Y.

Figure 8:
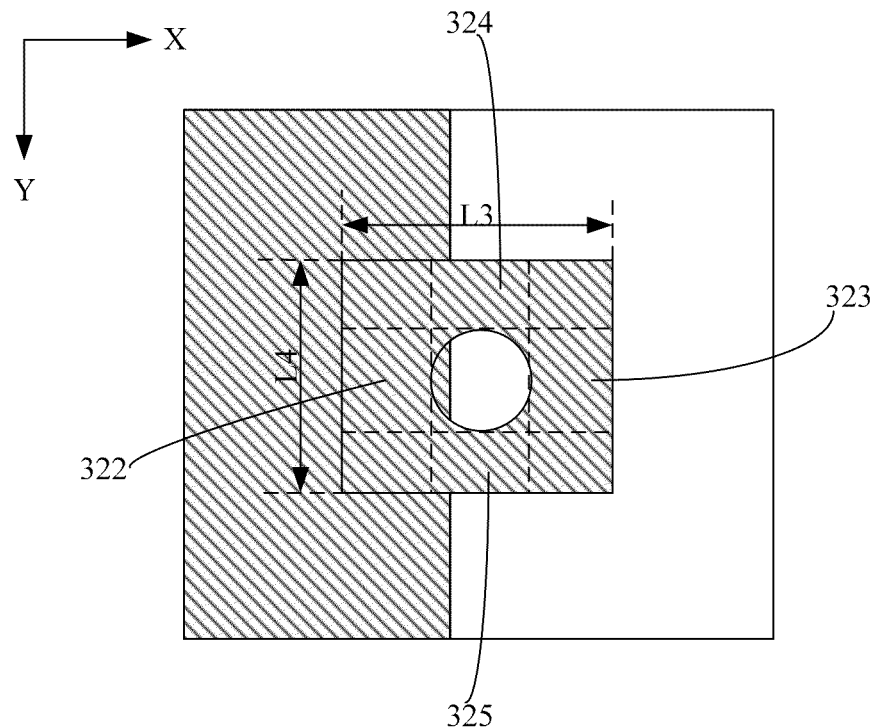
FIG. 8 is an enlarged view of B in FIG. 5.

FIG. 8 is an enlarged view of B in FIG. 5. In some exemplary embodiments, as shown in FIG. 8, the second align mask 320 includes a fifth side 322 and a sixth side 323 arranged at intervals along the first direction X, and a seventh side 324 and a eighth side 325 arranged at intervals along the second direction Y. The second align identifier 321 is disposed in an area enclosed by the fifth side 322, the sixth side 323, the seventh side 324 and the eighth side 325, and at least two of the fifth side 322, the sixth side 323, the seventh side 324 and the eighth side 325 are fixedly connected with the frame 100. In some examples, the fifth side 322 and sixth sides 323 are fixedly connected with the frame 100, or the seventh side 324 and eighth side 325 are fixedly connected with the frame 100, or one of the fifth side 322 and the sixth side 323 and one of the seventh side 324 and the eighth side 325 are fixedly connected with the frame 100. In other examples, the fifth side 322, the sixth side 323, the seventh side 324 and the eighth side 325 are all fixedly connected with the frame 100. In some exemplary embodiments, the fixed connection may be realized by bonding. At least two of the fifth side 322, the sixth side 323, the seventh side 324 and the eighth side 325 are fixedly connected with the frame 100, which can further prevent the interval between the first align mask 320 and the frame 100 and prevent the deviation of the align identifier 321 due to the loosening or the falling off of the second align mask 320.

In some exemplary embodiments, as shown in FIG. 8, the length L3 of the second align mask 320 in the first direction X is about 9 mm to 20 mm, and the length L4 of the second align mask 320 in the second direction Y is about 9 mm to 20 mm. The orthographic projection of the second align mask 320 on the first surface 102 may be rectangular. The second align identifier 321 is a second align hole, and the diameter of the second align hole is about 0.15 mm to 0.5 mm, such as 0.2 mm. In a direction perpendicular to the first surface 102, a thickness of the second align mask 320 may be about 30 micron to 100 microns.

In some exemplary embodiments, the second align mask 320 may be made of invar alloy.

In some exemplary embodiments, the first align identifier 311 and the second align identifier 321 on the first straight line may be formed in the same netting process, or the first align identifier 311 and the second align identifier 321 on the second straight line can be formed in the same netting process.

Figure 9:
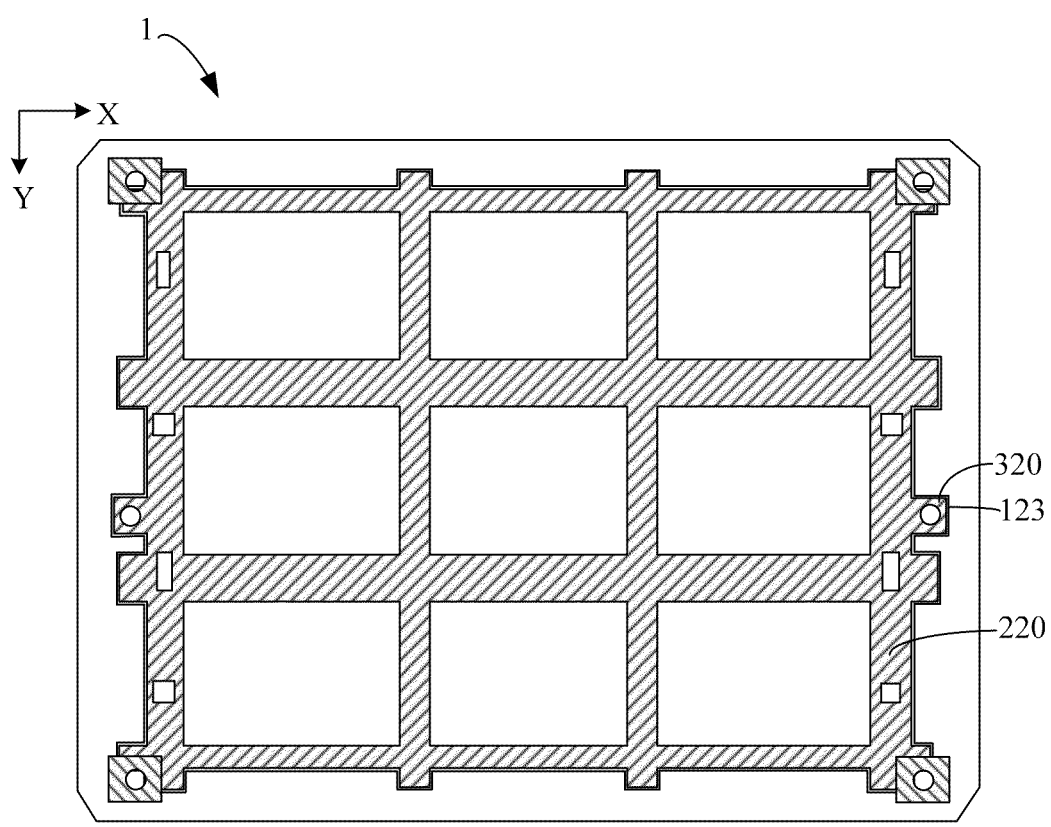
FIG. 9 is a diagram of the structure of another film mask according to an exemplary embodiment of the present disclosure.

FIG. 9 is a diagram of the structure of another film mask according to an exemplary embodiment of the present disclosure. In some exemplary embodiments, as shown in FIG. 9, the second align mask 320 is connected with the second side strip 212. The second frame edge 120 is provided with the mounting groove 123 communicating with the second mounting groove 121 and corresponding to the position of the second align mask 320. The second align mask 320 may be embedded into the fifth mounting groove 123. The distance between the surface of the second align mask 320 away from the frame 100 and the second surface 103 is approximately equal to the distance between the first surface 102 and the second surface 103. In another exemplary embodiment, the first align mask 310 is connected with the first side strip 211, and the first frame edge 110 is provided with a fifth mounting groove communicating with the first mounting groove 111 and corresponding to the position of the second align mask 320. In this example, the fifth mounting groove is used for mounting the align mask and therefore, it can also be referred to as an align mask mounting groove.

In some exemplary embodiments, the test holes are disposed on the first side strip, and the film mask further includes a plurality of fine film masks fixed on the frame. The fine film masks extend along the first direction and are arranged at intervals along the second direction. The fine film masks include a mask pattern area and a mask shielding area disposed at the periphery of the mask pattern area, and the mask pattern area corresponds to the sub-evaporation area.

In some exemplary embodiments, the test holes are disposed on the second side strip, and the film mask further includes a plurality of fine film masks fixed on the frame. The fine film masks extend along the second direction and are arranged at intervals along the first direction. The fine film masks include a mask pattern area and a mask shielding area disposed at the periphery of the mask pattern area, and the mask pattern area corresponds to the sub-evaporation area.

An embodiment of the present disclosure further provides a method for manufacturing the film mask which includes the following acts: fixing the frame which includes two first frame edges extending along a first direction and arranged at intervals along a second direction and two second frame edges extending along the second direction and arranged at intervals along the first direction, the first frame edges and the second frame edges intersecting to form a quadrilateral, and the first frame edges and the second frame edges including first surfaces and second surfaces which are oppositely disposed; forming a first align mask on the first surface of the frame, the first align mask being formed on at least three of the four angles of the quadrilateral, the first align mask being provided with a first align identifier, and the first direction intersecting with the second direction.

In some exemplary embodiments, forming the first align mask on the first surface of the frame includes fixing the align mask on the first frame edge or on the second frame edge by a netting process, a first align identifier being provided on the align mask, cutting the align mask with the peripheral area of the first align identifier being kept to form the first align mask. In an example, fixing the align mask on the first frame edge or on the second frame edge by a netting process, a first align identifier being provided on the align mask, cutting the align mask with the peripheral area of the first align identifier being kept to form the first align mask may include bonding the entire align mask to the first frame edge or the second frame edge of the frame, bonding the first bonding area formed in the periphery of the first align identifier, and cutting off the excess of the align mask except the first bonding area. In this example, only the align mask is provided with only a first align identifier without a test hole so that the align mask is more universal as it is not affected by the interval between the support frame and the frame, which improves efficiency of making the engineering drawing and reducing the risk of design errors.

In some exemplary embodiments, the align mask is provided with a second align identifier, and the manufacturing method further includes cutting the align mask with the peripheral area of the second align identifier kept to form a second align mask. In an example, cutting the align mask with the peripheral area of the second align identifier kept to form the second align mask may further include bonding the periphery of the second align mark to form a second bonding area, and cutting off the excess of the align mask except the first bonding area and the second bonding area.

In some exemplary embodiments, prior to forming the first align mask on the first surface of the frame, the manufacturing method further includes fixing a mask sheet on the frame, the mask sheet including a support frame and a second align mask provided on the support frame which is embedded in an align mask mounting groove provided on the frame at a position corresponding to the second align mask.

An embodiment of the present disclosure further provides a display panel manufactured with the film mask described in the above embodiments.

An embodiment of the present disclosure further provides a display device that includes the display panel provided in the aforementioned embodiment. The display device may be any product or component with a display function, such as a mobile phone, a tablet computer, a television, a display, a laptop computer, a digital photo frame, a navigator, etc.

The drawings in the present disclosure only relate to the structures involved in the present disclosure, and common designs may be referred to for other structures. The embodiments of the present disclosure, i.e., features in the embodiments may be combined with each other to obtain new embodiments where there is no conflict.

Those of ordinary skills in the art will understand that modifications or equivalent substitutions may be made to the technical solutions of the present disclosure without departing from the spirit and scope of the technical solutions of the present application, and shall be covered within the scope of the claims of the present application.

What we claim is:
1. A film mask,
comprising a frame, wherein the frame comprises two first frame edges and two second frame edges, the two first frame edges extend along a first direction and are arranged in a second direction with one interval between the two first frame edges, the two second frame edges extend along the second direction and are arranged in the first direction with one interval between the two second frame edges, and the first direction intersects with the second direction, the first frame edges and the second frame edges are connected to form a quadrilateral, the first frame edges comprise first surfaces and second surfaces which are oppositely disposed, and the second frame edges comprise first surfaces and second surfaces which are oppositely disposed, and further comprising a mask sheet, wherein the mask sheet comprises a support frame, the support frame comprises two first side strips extending along the first direction and arranged in the second direction with one interval between the two first side strips, and two second side strips extending along the second direction and arranged in the first direction with one interval between the two second side strips, ends of the first side strips and the second side strips are connected, the first side strips and the second side strips define an evaporation area, the first surface of the first frame edge is provided with a first mounting groove on an inner edge, the first surface of the second frame edge is provided with a second mounting groove on an inner edge, and the first side strip is lapped in the first mounting groove and the second side strip is lapped in the second mounting groove, further comprising a first align mask and a second align mask, wherein the first surfaces on at least three angles of the quadrilateral are provided with the first align mask, and the first align mask is provided with a first align identifier, the second align mask is disposed on the second frame edge, and the second align mask is provided with a second align identifier, and the second align mask is connected with the second side strip, the second frame edge is provided with an align mask mounting groove communicating with the second mounting groove and corresponding to a position of the second align mask, and the second align mask is embedded in the align mask mounting groove.

2. The film mask according to claim 1, wherein the first align mask comprises a first side and a second side arranged in the first direction with one interval between the first side and the second side, and a third side and a fourth side arranged in the second direction with one interval between the third side and the fourth side, the first align identifier is disposed in an area enclosed by the first side, the second side, the third side and the fourth side, and at least two of the first side, the second side, the third side and the fourth side are fixedly connected with the first frame edge and second frame edge of the frame.

3. The film mask according to claim 1, wherein a length of the first align mask in the first direction is 9 mm to 20 mm, and a length of the first align mask in the second direction is 9 mm to 20 mm.

4. The film mask according to claim 1, wherein the first side strip has a surface flush with the first surface, and a distance between the surface of the first side strip and the second surface is equal to a distance between the first surface and the second surface; and the second side strip has a surface flush with the first surface, and a distance between the surface of the second side strip and the second surface is equal to a distance between the first surface and the second surface.

5. The film mask according to claim 1, wherein the second side strip is provided with a plurality of test holes arranged at intervals along the second direction;

orthographic projections of the test holes on a plane of the first surface do not overlap with the first surface.

6. The film mask according to claim 1, wherein the second align mask is disposed in middle of the second frame edge.

7. The film mask according to claim 1, wherein centers of the first align identifier and the second align identifier on the same second frame edge are disposed on a second straight line parallel to the second direction.

8. The film mask according to claim 1, wherein the second align mask comprises a fifth side and a sixth side arranged in the first direction with one interval between the fifth side and the sixth side, and a seventh side and an eighth side arranged in the second direction with one interval between the seventh side and the eighth side, the second align identifiers are disposed in an area enclosed by the fifth side, the sixth side, the seventh side and the eighth side, and at least two of the fifth side, the sixth side, the seventh side and the eighth side are fixedly connected with second frame edge of the frame.

9. The film mask according to claim 1, wherein a length of the second align mask in the first direction is 9 mm to 20 mm and a length of the second align mask in the second direction is 9 mm to 20 mm.

10. A manufacturing method of a film mask, comprising:

fixing a frame, wherein the frame comprises two first frame edges and two second frame edges, the two first frame edges extend along a first direction and are arranged in a second direction with one interval between the two first frame edges, the two second frame edges extend along the second direction and are arranged in the first direction with one interval between the two second frame edges, the first direction intersects with the second direction, the first frame edges and the second frame edges are connected to form a quadrilateral, the first frame edges comprise first surfaces and second surfaces which are oppositely disposed, and the second frame edges comprise first surfaces and second surfaces which are oppositely disposed;

fixing a mask sheet on the frame, wherein the mask sheet comprises a support frame the support frame comprises two first side strips extending along the first direction and arranged in the second direction with one interval between the two first side strips, two second side strips extending along the second direction and arranged in the first direction with one interval between the two second side strips, ends of the first side strips and the second side strips are connected, the first side strips and the second side strips define an evaporation area, the first surface of the first frame edge is provided with a first mounting groove on an inner edge, the first surface of the second frame edge is provided with a second mounting groove on an inner edge, and the first side strip is lapped in the first mounting groove and the second side strip is lapped in the second mounting groove; and forming a first align mask and a second align mask, wherein the first surfaces on at least three angles of the quadrilateral are provided with the first align mask and the first align mask is provided with a first align identifier, and wherein the second align mask is disposed on the second frame edge, the second align mask is provided with a second align identifier, the second align mask is connected with the second side strip, the second frame edge is provided with an align mask mounting groove communicating with the second mounting groove and corresponding to a position of the second align mask, and the second align mask is embedded in the align mask mounting groove.

11. The manufacturing method according to claim 10, wherein forming the first align mask comprises: fixing the first align mask on the first surfaces by a netting process, and cutting the first align mask such that a peripheral area of the first align identifier is kept to form the first align mask.

12. The manufacturing method according to claim 11, wherein forming the second align mask comprises: cutting the second align mask such that a peripheral area of the second align identifier is kept to form the second align mask.

\* \* \* \* \*